US008710571B2

(12) United States Patent
Liao

(10) Patent No.: US 8,710,571 B2
(45) Date of Patent: Apr. 29, 2014

(54) POLARITY SWITCHING MEMBER OF DOT INVERSION SYSTEM

(75) Inventor: Min-Nan Liao, Sindian (TW)

(73) Assignee: Sitronix Technology Corp, Hsinchu County (TW)

(*) Notice: Subject to any disclaimer, the term of this patent is extended or adjusted under 35 U.S.C. 154(b) by 212 days.

(21) Appl. No.: 12/486,340

(22) Filed: Jun. 17, 2009

(65) Prior Publication Data

US 2010/0026356 A1 Feb. 4, 2010

(30) Foreign Application Priority Data

Jul. 31, 2008 (TW) ............................... 97129091 A

(51) Int. Cl.
*H01L 29/76* (2006.01)

(52) U.S. Cl.
USPC ........... 257/314; 257/338; 257/339; 257/351; 257/371; 257/525

(58) Field of Classification Search
CPC ..................................................... G09G 3/3614
USPC .......... 257/314, 338–339, 351, 371, 525, 548
See application file for complete search history.

(56) References Cited

U.S. PATENT DOCUMENTS 4,072,974 A * 2/1978 Ipri .............................. 257/351
5,028,978 A * 7/1991 Hall .............................. 257/370
5,930,191 A * 7/1999 Jeon .............................. 365/226
5,969,385 A * 10/1999 Nathanson .................... 257/347
5,994,755 A * 11/1999 DeJong et al. ................ 257/500
5,995,073 A * 11/1999 Isami et al. ...................... 345/89
6,100,557 A * 8/2000 Hung et al. .................. 257/299
6,335,721 B1 * 1/2002 Jeong ............................ 345/100
6,373,459 B1 * 4/2002 Jeong ............................ 345/100
6,707,442 B2 * 3/2004 Watanabe ..................... 345/100
6,731,170 B2 * 5/2004 Juang ............................ 330/261
6,787,795 B2 * 9/2004 Uchida et al. ................... 257/30
6,864,543 B2 * 3/2005 Kaneko et al. ................ 257/371
6,881,997 B2 * 4/2005 Kaneko et al. ................ 257/299
6,924,782 B1 * 8/2005 Fujioka et al. .................. 345/92
6,927,442 B2 * 8/2005 Kaneko et al. ................ 257/299
6,970,033 B1 * 11/2005 Blankenship ................ 327/408
7,122,861 B2 * 10/2006 Mori ............................ 257/339
7,298,010 B1 * 11/2007 Ma ............................... 257/359

(Continued)

FOREIGN PATENT DOCUMENTS

TW 200641785 12/2006

*Primary Examiner* — Fernando L Toledo
*Assistant Examiner* — Mohammed Shamsuzzaman
(74) *Attorney, Agent, or Firm* — Ming Chow; Sinorica, LLC

(57) ABSTRACT

A polarity switching member of a dot inversion system is revealed. A first transistor and a second transistor are disposed in a P-well while a N-well is arranged in the P-well, located between the first transistor and the second transistor. The N-well includes a third transistor and a fourth transistor. One end of the third transistor is coupled to one end of the first transistor to generate a first input end and one end of the fourth transistor is coupled to one end of the second transistor to generate a second input end. The other end of the first transistor, the other end of the second transistor, the other end of the third transistor, and the other end of the fourth transistor are coupled to generate an output end. Thereby, by switching of voltage polarity of the P-well and the N-well, a larger range of output voltage difference is achieved.

14 Claims, 6 Drawing Sheets

(56) References Cited

U.S. PATENT DOCUMENTS

| | | | | |
|---|---|---|---|---|
| 7,349,273 | B2 * | 3/2008 | Zimlich | 365/201 |
| 7,450,102 | B2 * | 11/2008 | Lin et al. | 345/98 |
| 7,538,704 | B2 * | 5/2009 | Dent et al. | 341/143 |
| 7,656,419 | B2 * | 2/2010 | Hashimoto | 345/690 |
| 2002/0015347 | A1 * | 2/2002 | Kitamoto | 365/226 |
| 2002/0041274 | A1 * | 4/2002 | Watanabe | 345/204 |
| 2003/0218494 | A1 | 11/2003 | Kubo et al. | |
| 2004/0135778 | A1 * | 7/2004 | Sato et al. | 345/204 |
| 2004/0207593 | A1 * | 10/2004 | Ha et al. | 345/100 |
| 2005/0206635 | A1 * | 9/2005 | Hashimoto | 345/204 |
| 2007/0080406 | A1 * | 4/2007 | Snyder et al. | 257/369 |
| 2008/0036530 | A1 | 2/2008 | Chang | |
| 2008/0062112 | A1 * | 3/2008 | Umezaki | 345/100 |
| 2008/0169498 | A1 * | 7/2008 | Dhaoui et al. | 257/315 |
| 2008/0170025 | A1 | 7/2008 | Song et al. | |
| 2009/0040245 | A1 * | 2/2009 | Hashimoto | 345/690 |
| 2009/0127589 | A1 * | 5/2009 | Rothberg et al. | 257/253 |
| 2009/0284516 | A1 * | 11/2009 | Hashimoto | 345/211 |
| 2009/0315118 | A1 * | 12/2009 | Yu | 257/369 |

* cited by examiner

| | | | | |
|---|---|---|---|---|
| + | − | + | − | + |
| − | + | − | + | − |
| + | − | + | − | + |
| − | + | − | + | − |
| + | − | + | − | + |

Fig. 2A(Prior art)

| | | | | |
|---|---|---|---|---|
| − | + | − | + | − |
| + | − | + | − | + |
| − | + | − | + | − |
| + | − | + | − | + |
| − | + | − | + | − |

Fig. 2B(Prior art)

| Polarity | A | B | PAD |
| --- | --- | --- | --- |
| + | +V0~V63 | 0V | +V0~V63 |
| − | 0V | -V0~V63 | -V0~V63 |

Fig. 6

POLARITY SWITCHING MEMBER OF DOT INVERSION SYSTEM

BACKGROUND OF THE INVENTION

1. Field of Invention

The present invention relates to a dot inversion system of displays, especially to a polarity switching member of a dot inversion system.

2. Description of Related Art

Due to fast development of modern technology, manufactures of information products bring out more and more products to satisfy various requirements of people. In early days, most of the displays use Cathode Ray Tubes (CRT). The CRT has shortcomings of large volume, high power consumption and the radiation that may have effects on human health after long term use so that it is gradually replaced by liquid crystal display (LCD) that has compact volume, low radiation and low power consumption. Therefore, the LCD has become the mainstream on the market.

The liquid crystal material used in the Liquid crystal displays has different refractive indexes and dielectric constants. The difference of the refractive indexes leads to polarization change ability of the liquid crystal and the difference of the dielectric constants results in various rotation angles of liquid crystal under the influence of the electric field. Thus by change of the refractive index in combination with polarizers, the amount of light passes can be controlled. The liquid crystal itself is not conductive while positive charge and negative charge in the liquid crystal are separated from each other. Once an electric field is applied, the liquid crystal molecules aligns and under control of the electric field. Moreover, when a direct current field is applied across, the charges in the liquid crystal molecules are fixed and the liquid crystal molecules posses dipole moments. This leads to late response of the liquid crystal molecules. Thus an alternative current is use to drive the liquid crystal molecules. Once there are some residual charges from direct current in the liquid crystal molecules, the cell response of the liquid crystal molecules is delayed while changing the tilted angle of individual liquid crystal molecules. This causes image sticking and flicker. The liquid crystal modules include liquid crystal molecules filled between an upper polarizing filter and a lower polarizing filter. When being applied with an alternative current, directions of the electric field between the upper polarizing filter and the lower polarizing filter changes alternatively. The AC driving method of liquid crystal displays includes four types-Frame Inversion, Line Inversion, Column/Data/Source Inversion, and Dot Inversion.

Generally, the liquid crystal displays use line inversion and dot inversion. Refer to FIG. 1A & FIG. 1B, a schematic drawing showing a line inversion system of a conventional technique. As shown in figures, a driving way of the line inversion is that each horizontal line (a line of liquid crystal cells) has opposite polarity as compared to its direct neighbor while driving the liquid crystal molecules. Now the signal change frequency of the common electrode is a half of the horizontal scanning frequency (Horizontal Scanning Frequency/2). The horizontal scanning frequency is the number of horizontal lines scanned by the electron beam in a television receiver in 1 second. The polarity change frequency of each horizontal line is the same with that of the frame inversion-a half of the vertical scanning frequency. The flicker frequency of each horizontal line is the same with the flicker frequency of the frame inversion. Because that each horizontal line has opposite polarity as compared to its direct neighbor at any time, the liquid crystal molecules in the vertical direction have high-frequency polarity change. Such way can reduce the flicker.

Refer to FIG. 2A & FIG. 2B, a schematic drawing showing polarity switch member of a dot inversion system of a conventional technique. As shown in figures, a driving way of the dot inversion is that each liquid crystal cell has opposite polarity as compared to the surrounding neighbors. The dot inversion can be considered as a combination of the line inversion and the Column/Data/Source Inversion. The disposition way of the source driver chip of the dot inversion is the same with that of the line inversion. The polarity of the output signal of the upper source driver chip is opposite to that of the lower source driver chip. The signal polarity changes once per a horizontal scanning cycle. After a vertical scanning cycle, the signal polarity changes again. The switching frequency of polarity of each liquid crystal cell is maintained at half of vertical scanning frequency. Each of the liquid crystal cells in the vertical direction and in the horizontal direction has different polarity. Under high switching frequency of the polarity of the liquid crystal cells in the vertical and horizontal directions, the images have good average effects and the flicker is further eliminated.

However, driving chips in small-size Thin-Film Transistor Liquid-Crystal Displays can be driven only by line inversion due to constraints for manufacturing processes. The line inversion way may have display flicker effects. For the Thin-Film Transistor Liquid-Crystal Displays, the dot inversion can eliminate the flicker effect. In order to achieve dot inversion, the voltage difference of the source driver output ranges from 10 to 12 volt. Yet the withstand voltage of the middle voltage components produced by the mass-production processes available now are only 5~6.5 volt and are unable to be applied with dot inversion that requires 10~12 volt.

Thus there is a need to provide a novel polarity switching member of a dot inversion system that the component with withstand voltage of about 5 volt can achieve 10 volt voltage difference by switching of voltage polarity of the P-well and the N-well so as to drive the display panels.

SUMMARY OF THE INVENTION

Therefore it is a primary object of the present invention to provide a polarity switching member of a dot inversion system that achieve larger output voltage difference by switching polarity of a P-well and a N-well.

A polarity switching member of a dot inversion system according to the present invention includes a P-well, a first transistor, a second transistor, a N-well, a third transistor, and a fourth transistor. Both the first transistor and the second transistor are disposed in the P-well while the N-well is arranged in the P-well, located between the first transistor and the second transistor. The third transistor is arranged in the N-well and one end of the third transistor is coupled to one end of the first transistor to generate a first input end. The fourth transistor is disposed in the N-well and one end of the fourth transistor is coupled to one end of the second transistor to generate a second input end. The other end of the first transistor, the other end of the second transistor, the other end of the third transistor, and the other end of the fourth transistor are coupled to generate an output end.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 2A is a schematic drawing showing dot inversion of a prior art;

FIG. 2B is a schematic drawing showing dot inversion of a prior art;

FIG. 6 is a list showing output voltage of the switch circuit of an embodiment according to the present invention.

DETAILED DESCRIPTION OF THE PREFERRED EMBODIMENT

Figure 1:
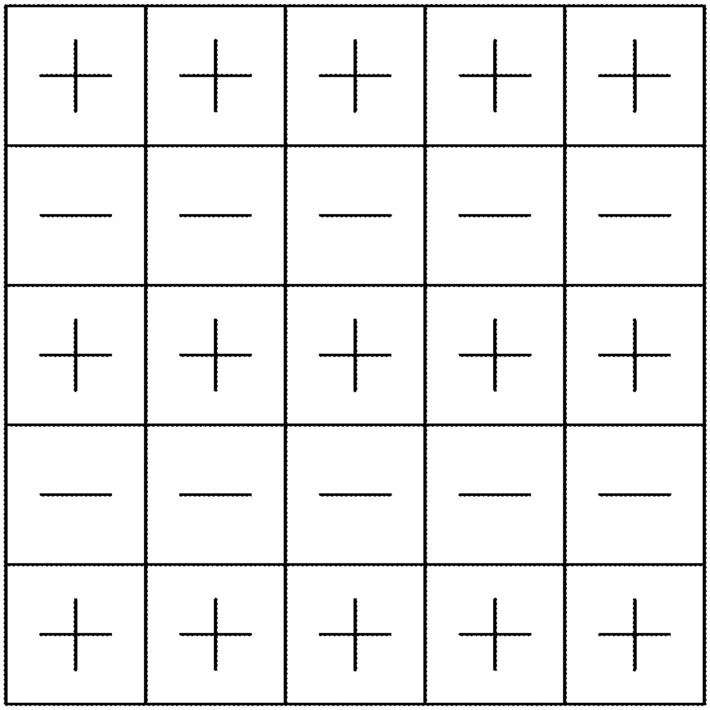
Fig. 1 A(Prior art)
FIG. 1A is a schematic drawing showing line inversion of a prior art.
FIG. 1B is a schematic drawing showing line inversion of a prior art.
Figure 1:
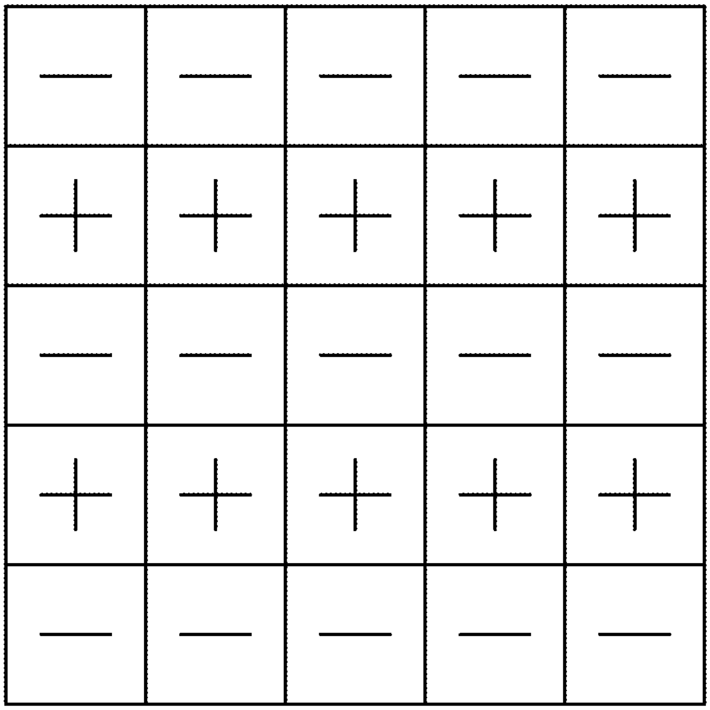
Fig. 1 B(Prior art)
Figure 3:
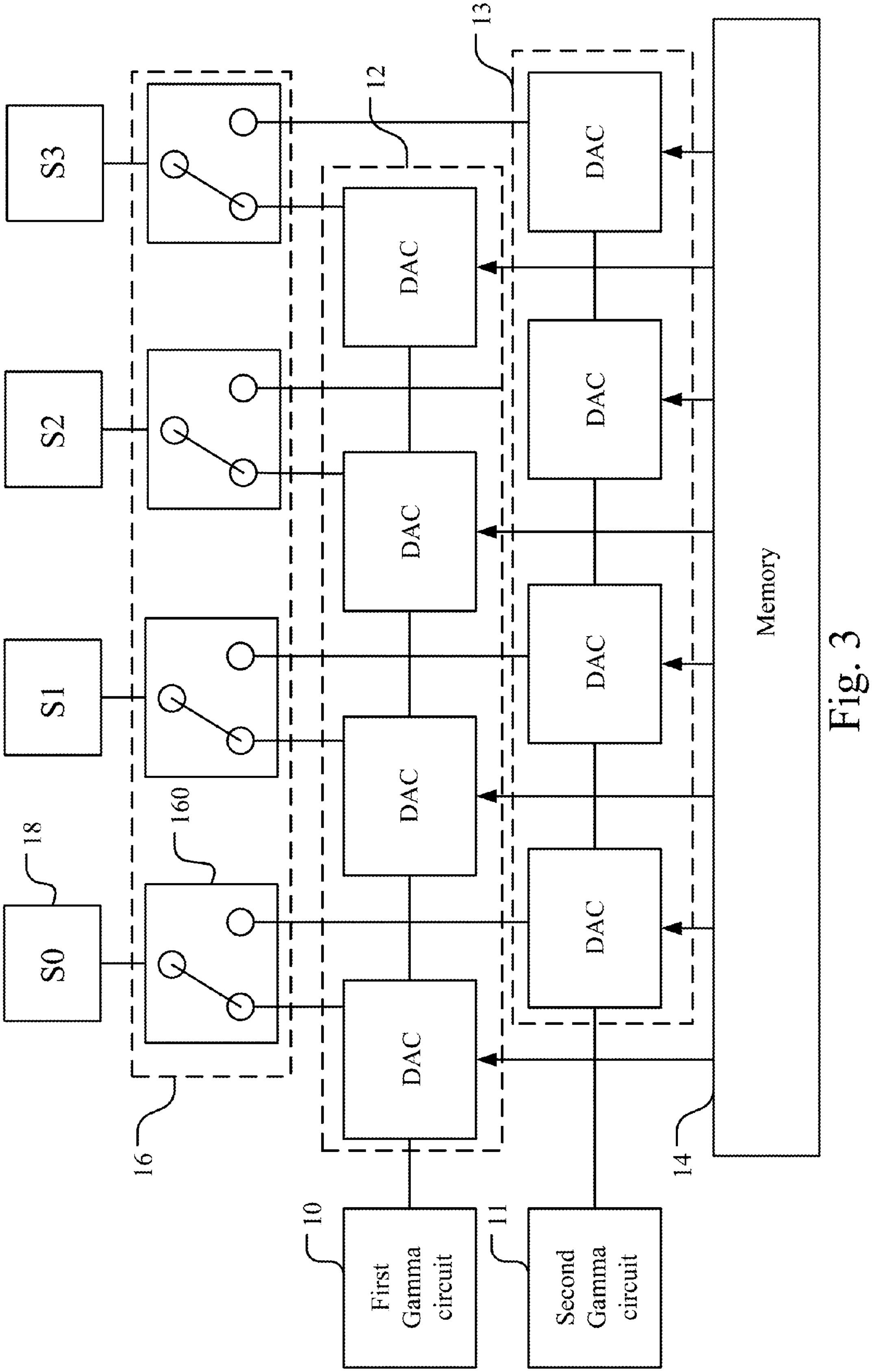
FIG. 3 is a schematic drawing showing a source driver of an embodiment according to the present invention.

Refer to FIG. 3, a schematic drawing showing a source driver of an embodiment according to the present invention is disclosed. The source driver of the present invention consists of a first Gamma circuit 10, a second Gamma circuit 11, a first digital to analog conversion (DAC) module 12, a second DAC module 13, a memory 14 and a switch module 16. According to the gamma curve, the first Gamma circuit 10 as well as the second Gamma circuit 11 is divided into 64 voltage levels. The first Gamma circuit 10 is divided into 64 positive voltage levels, ranging from 0 to 5 volt. The second Gamma circuit 11 is divided into 64 negative voltage levels, ranging from 0 to 5 volt. Moreover, the first Gamma circuit 10 as well as the second Gamma circuit 11 respectively transmits signals of the positive voltage level as well as signals of the negative voltage level to the first DAC module 12 as well as the second DAC module 13. The first DAC module 12 and the second DAC module 13 respectively include 64 sets of digital to analog conversion (DAC) circuit for receiving and converting 64 different voltage levels. Besides receiving signals from the Gamma circuit 10, 11, the first DAC module 12 and the second DAC module 13 retrieve signals in the memory 14 so as to realize which one of the first DAC module 12 and the second DAC module 13 is going to convert the voltage signal. That means the memory 14 stores signals of the image to be displayed and the first DAC module 12 and the second DAC module 13 retrieve signals of the images so as to learn the polarity of the voltage level to be converted is corresponding to which set of DAC circuit in the first DAC module 12 and the second DAC module 13. Then the switch module 16 converts the polarity in respect to the 64 voltage levels according to the image signals in the memory 14 and sends the signals converted by the DAC circuit to a data line to be displayed by a display panel.

The output voltage of the source driver in the dot-inversion system ranges within 10V. As to the middle voltage components produced by general manufacturing processes, the output voltage range is only 5V. Thus the switch module 16 of the present invention is switching by the well of the transistors so as to achieve the switching to 10 V from 5V. The following is detailed description of the switch circuit of the switch module 16.

Figure 4:
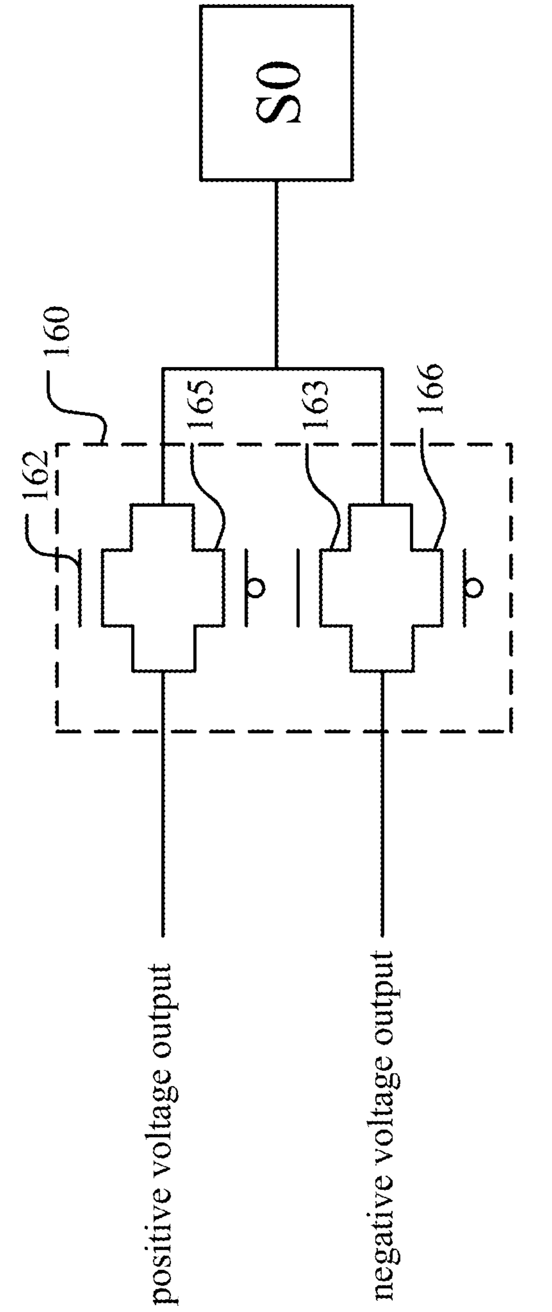
FIG. 4 is a schematic drawing showing a switch circuit of an embodiment according to the present invention.
Figure 5:
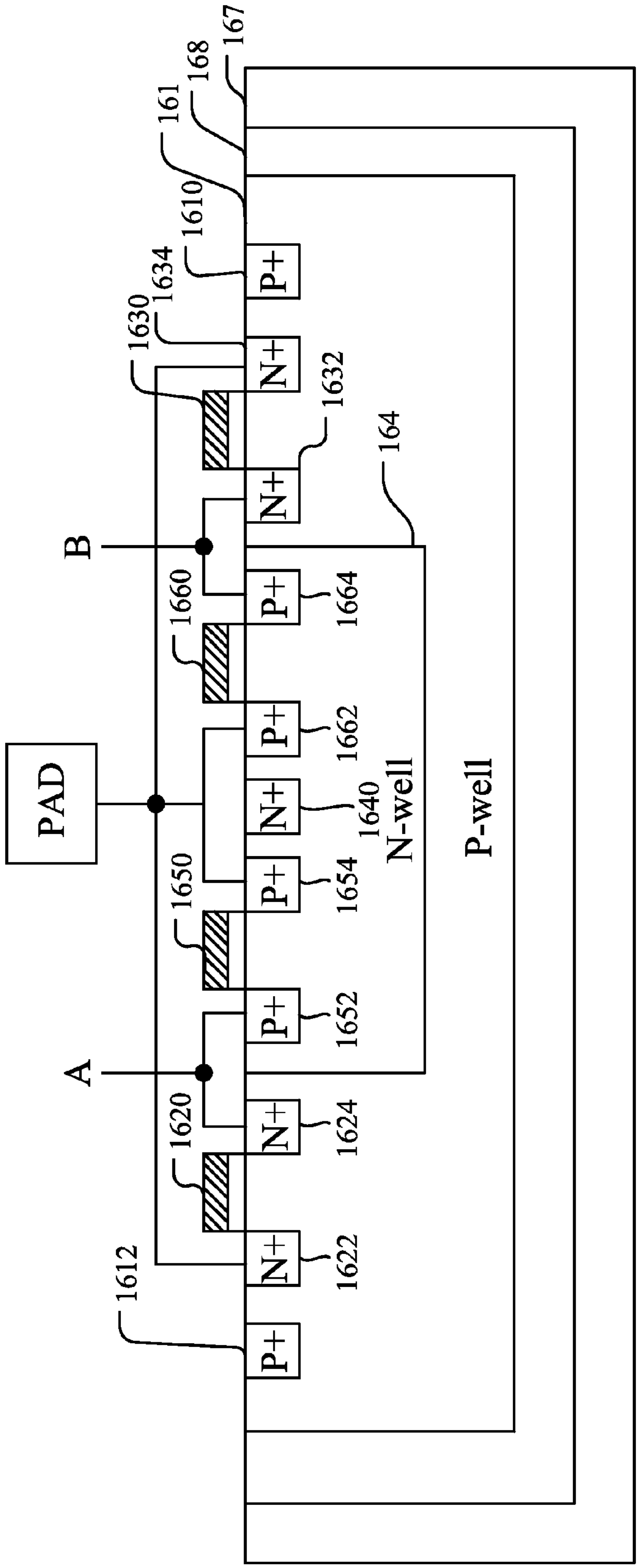
FIG. 5 is a schematic drawing showing a switch circuit of an embodiment according to the present invention.

Refer from FIG. 4 & FIG. 5, both show structure of a switch circuit of an embodiment according to the present invention. A polarity switching member of a dot inversion system according to the present invention includes a P-well 161, a first transistor 162, a second transistor 163, a N-well 164, a third transistor 165, and a fourth transistor 166. The first transistor 162 and the second transistor 163 are disposed in the P-well 161 while the N-well 164 is also arranged in the P-well 161, located between the first transistor 162 and the second transistor 163. The third transistor 165 is arranged in the N-well 164 and one end thereof is coupled to the first transistor 162 so as to generate a first input end A. The fourth transistor 166 is disposed in the N-well 164 and one end of the fourth transistor 166 is connected to one end of the second transistor 163 to generate a second input end B. The other end of the first transistor 162, the other end of the second transistor 163, the other end of the third transistor 165, and the other end of the fourth transistor 166 are coupled to generate an output end that is connected with an output pad(PAD).

The polarity switching member is working in the following way: when a first input signal is received by the first input end A, the second input end B receives a second input signal while once the first input signal is within a first input range, the second input signal is a low-level signal. Once the first input range is 0~5V, the switching member is switched into positive voltage output by the P-well 161. Once the second input signal is within a second input range, the first input signal is a low-level signal. Once the second input range is 0~5V, the switching member is switched into negative voltage output by the N-well 164.

Thus by switching polarity of the P-well 161 and that of the N-well 164, the polarity switching member of the present invention achieves larger voltage difference output. As shown in the FIG. 5, the N-well 164 includes a N-doping area 1640. The N-doping area 1640 is coupled to a reference voltage, so voltage level of the N-well 164 is biased to the reference voltage. Therefore, the voltage polarity of the N-well 164 is equal to the polarity of the reference voltage. Further, the P-well 161 includes two P-doping areas 1610, 1612. The P-doping areas 1610, 1612 are coupled to another reference voltage, so the voltage levels of the P-doping areas 1610, 1612 are biased to said another reference voltage. Therefore, the voltage polarity of the P-well 161 is equal to the polarity of said another reference voltage. Thereby, the polarity change of said another reference voltage can achieve that the polarity of the P-well 161 is changed. As shown in FIG. 6, by switching the voltage polarity of the P-well 161 into positive voltage (the first input signal is +V0~V63, 0~5V) and switching the voltage polarity of the N-well 164 into negative voltage (the second input signal is –V0~V63, 0~–5V), the output voltage difference of the output end (PAD) with the output pad achieves 10V.

Refer to FIG. 5, the first transistor 162 includes a first gate-oxide layer 1620, a first N-type doping area 1622, and a second N-type doping area 1624. The first gate-oxide layer 1620 is disposed over the P-well 161, the first N-type doping area 1622 is in the P-well 161 and is located on one side of the first gate-oxide layer 1620 and the second N-type doping area 1624 is arranged in the P-well 161 and is located on the other side of the first gate-oxide layer 1620. In similar way, the second transistor 163 consists of a second gate-oxide layer 1630, a third N-type doping area 1632, and a fourth N-type doping area 1634. The second gate-oxide layer 1630 is disposed over the P-well 161 and the third N-type doping area 1632 is in the P-well 161 and is located on one side of the second gate-oxide layer 1630. The fourth N-type doping area 1634 is located in the P-well 161 and is located on the other side of the second gate-oxide layer 1630.

Furthermore, the third transistor 165 consists of a third gate-oxide layer 1650, a first P-type doping area 1652, and a second P-type doping area 1654. The third gate-oxide layer 1650 is disposed over the N-well 164 and the first P-type doping area 1652 is in the N-well 164 and is located on one side of the third gate-oxide layer 1650. The second P-type doping area 1654 is located in the the N-well 164 and is located on the other side of the third gate-oxide layer 1650. Similarly, the fourth transistor 166 consists of a fourth gate-oxide layer 1660, a third P-type doping area 1662, and a fourth P-type doping area 1664. The fourth gate-oxide layer 1660 is disposed over the N-well 164 and the third P-type doping area 1662 is in the N-well 164 and is located on one side of the third gate-oxide layer 1650. The fourth P-type doping area 1664 is located in the the N-well 164 and is located on the other side of the fourth gate-oxide layer 1660. In accordance with the above structure, the second N-type doping area 1624 is coupled to the first P-type doping area 1652, the second P-type doping area 1654 is coupled to the third P-type doping area 1662, and the fourth P-type doping area 1664 is coupled to the third N-type doping area 1632. The first N-type doping area 1622, the second P-type doping area 1654, the third P-type doping area 1662 and the fourth N-type doping area 1634 are coupled together with one another.

In addition, the polarity switching member of the present invention further includes a substrate 167 and an isolation layer 168. The substrate 167 is disposed under the P-well 161 for being used by other circuit in the display device while the isolation layer 168 is arranged between the substrate 167 and the P-well 161 for being isolated from other circuit and without being affected by other circuit.

In summary, a polarity switching member of a dot inversion system according to the present invention uses middle voltage components with the withstand voltage of 5 volt to achieve 10 volt output voltage difference by switching of voltage polarity of the P-well and the N-well.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A polarity switching member of a dot inversion system for display, comprising:

a P-well, a N-type first transistor disposed in the P-well, a N-type second transistor disposed in the P-well, a N-well disposed in the P-well and located between the first transistor and the second transistor, a P-type third transistor disposed in the N-well and one end of the third transistor being coupled to one end of the first transistor to be a first input end, and a P-type fourth transistor disposed in the N-well and one end of the fourth transistor being coupled to one end of the second transistor to be a second input end;

wherein the other end of the first transistor, the other end of the second transistor, the other end of the third transistor, and the other end of the fourth transistor are coupled to be an output end;

wherein the first input end receives a first input signal and the second input end receives a second input signal, while the first input signal is within a first input range from 0 volt to 5 volt and the second input signal is a low-level signal, the N-well is a positive voltage polarity and the output end outputs the first input signal; while the second input signal is within a second input range from 0 volt to 5 volt and the first input signal is the low-level signal, the P-well is a negative voltage polarity and the output end outputs the second input signal;

wherein while the first input signal and the second input signal are changed, the voltage polarity of the N-well and the voltage polarity of the P-well both are changed and a 10 volt output voltage is achieved at the output end to drive the display.

2. The device as claimed in claim 1, wherein the first transistor comprising:

a gate-oxide layer disposed over the P-well, a first N-type doping area disposed in the P-well and located on one side of the gate-oxide layer, and a second N-type doping area disposed in the P-well and located on the other side of the gate-oxide layer.

3. The device as claimed in claim 2, wherein the first N-type doping area is coupled to the third transistor and the second N-type doping area is coupled to the second transistor, the third transistor and the fourth transistor.

4. The device as claimed in claim 1, wherein the second transistor comprising:

a gate-oxide layer disposed over the P-well, a first N-type doping area disposed in the P-well and located on one side of the gate-oxide layer, and a second N-type doping area disposed in the P-well and located on the other side of the gate-oxide layer.

5. The device as claimed in claim 4, wherein the first N-type doping area is coupled to the fourth transistor and the second N-type doping area is coupled to the first transistor, the third transistor and the fourth transistor.

6. The device as claimed in claim 1, wherein the third transistor comprising:

a gate-oxide layer disposed over the N-well, a first P-type doping area disposed in the N-well and located on one side of the gate-oxide layer, and a second P-type doping area disposed in the N-well and located on the other side of the gate-oxide layer.

7. The device as claimed in claim 6, wherein the first P-type doping area is coupled to the first transistor and the second P-type doping area is coupled to the first transistor, the second transistor and the fourth transistor.

8. The device as claimed in claim 1, wherein the fourth transistor comprising:

a gate-oxide layer disposed over the N-well, a first P-type doping area disposed in the N-well and located on one side of the gate-oxide layer, and a second P-type doping area disposed in the N-well and located on the other side of the gate-oxide layer.

9. The device as claimed in claim 8, wherein the first P-type doping area is coupled to the second transistor and the second P-type doping area is coupled to the first transistor, the second transistor and the third transistor.

10. The device as claimed in claim 1, wherein the polarity switching member of a dot inversion system comprising:

a substrate disposed under the P-well, and an isolation layer disposed between the substrate and the P-well.

11. The device as claimed in claim 1, wherein the output end is coupled to an output pad.

12. The device as claimed in claim 1, wherein the first transistor, the second transistor, the third transistor and the fourth transistor respectively are a metal-oxide-semiconductor field-effect transistor (MOSFET).

13. The device as claimed in claim 1, wherein the first transistor and the third transistor form a complementary metal-oxide-semiconductor (CMOS).

14. The device as claimed in claim 1, wherein the second transistor and the fourth transistor form a complementary metal-oxide-semiconductor (CMOS).

* * * * *